(12) United States Patent
Stenson et al.

(10) Patent No.: US 12,417,327 B2
(45) Date of Patent: Sep. 16, 2025

(54) TECHNIQUES FOR HEURISTICS-BASED SIMULATION OF ATMOSPHERIC EFFECTS IN AN AV SIMULATION SYSTEM

(71) Applicant: GM Cruise Holdings LLC, San Francisco, CA (US)

(72) Inventors: Richard Stenson, Miami, FL (US); Jacqueline Chu, Danville, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 964 days.

(21) Appl. No.: 17/534,640

(22) Filed: Nov. 24, 2021

(65) Prior Publication Data

US 2023/0161933 A1 May 25, 2023

(51) Int. Cl.
*G06F 30/25* (2020.01)
*B60W 60/00* (2020.01)
*G01S 17/88* (2006.01)

(52) U.S. Cl.
CPC .............. *G06F 30/25* (2020.01); *G01S 17/88* (2013.01); *B60W 60/001* (2020.02)

(58) Field of Classification Search
CPC ....... G06F 30/25; G01S 17/88; B60W 60/001
USPC .......................................................... 703/6
See application file for complete search history.

(56) References Cited

U.S. PATENT DOCUMENTS

| | | | |
|---|---|---|---|
| 11,069,082 B1 * | 7/2021 | Ebrahimi Afrouzi | H04N 23/56 |
| 11,656,629 B1 * | 5/2023 | Armstrong-Crews | G01S 17/88 |
| | | | 701/25 |
| 11,702,101 B2 * | 7/2023 | Aota | B60W 30/143 |
| | | | 701/23 |
| 11,767,030 B1 * | 9/2023 | Bagschik | B60W 60/0015 |
| | | | 701/23 |
| 11,814,080 B2 * | 11/2023 | Sakamoto | G06F 11/3692 |
| 2010/0164974 A1 * | 7/2010 | Fairclough | G06T 15/50 |
| | | | 345/589 |
| 2017/0286570 A1 * | 10/2017 | Kim | G06F 11/3688 |
| 2019/0146492 A1 * | 5/2019 | Phillips | G05B 13/041 |
| | | | 701/23 |
| 2020/0184027 A1 * | 6/2020 | Dolan | G01S 13/931 |
| 2020/0209366 A1 * | 7/2020 | Maleki | G01S 17/34 |
| 2020/0284883 A1 * | 9/2020 | Ferreira | G01S 7/4815 |
| 2020/0284913 A1 * | 9/2020 | Amelot | G01S 7/4808 |
| 2020/0301013 A1 * | 9/2020 | Banerjee | G01S 17/931 |

(Continued)

OTHER PUBLICATIONS

Hahner et al. ("Fog Simulation on Real LiDAR Point Clouds for 3D Object Detection in Adverse Weather", arXiv, Aug. 2021, pp. 1-10). (Year: 2021).*

(Continued)

*Primary Examiner* — Iftekhar A Khan
(74) *Attorney, Agent, or Firm* — CANTOR COLBURN LLP (57) ABSTRACT

Techniques for simulating an atmospheric effect in an AV simulation system are described. In one embodiment, a method for simulating an atmospheric effect including a plurality of particles suspended in an atmosphere may include receiving a first parameter defining a density of the plurality of particles comprising the atmospheric effect; receiving at least one second parameter defining a location of the atmospheric effect relative to a vehicle in a scene generate by the simulation system; and simulating the atmospheric effect in the scene as defined by the first parameter and the at least one second parameter.

19 Claims, 8 Drawing Sheets

(56) References Cited

U.S. PATENT DOCUMENTS

| | | | | |
|---|---|---|---|---|
| 2021/0097147 A1* | 4/2021 | DeVore | ............... | G06F 18/22 |
| 2021/0239812 A1* | 8/2021 | Meng | ............... | G05B 19/0426 |
| 2021/0278257 A1* | 9/2021 | Dharia | ............... | G01S 17/89 |
| 2021/0294944 A1* | 9/2021 | Nassar | ............... | G05D 1/0088 |
| 2021/0350713 A1* | 11/2021 | Van Meeteren | ..... | G05D 1/0022 |
| 2022/0126878 A1* | 4/2022 | Moustafa | ............ | B60W 40/09 |
| 2022/0187841 A1* | 6/2022 | Ebrahimi Afrouzi | ............ | G05D 1/0274 |
| 2022/0318450 A1* | 10/2022 | Stenson | ............... | G06F 30/20 |
| 2023/0080540 A1* | 3/2023 | Unger | ............... | G06F 30/27 356/5.01 |
| 2023/0185992 A1* | 6/2023 | Dunkin | ............... | G06T 19/003 703/15 |
| 2024/0232460 A1* | 7/2024 | Cruz | ............... | G06F 30/15 |
| 2024/0311529 A1* | 9/2024 | Partridge | ............... | G06F 30/20 |

OTHER PUBLICATIONS

Sinan Hasirlioglu (A Novel Method for Simulation-based Testing and Validation of Automotive Surround Sensors under Adverse Weather Conditions, Johannes Kepler University, 2020, pp. 1-145) (Year: 2020).*

Kilic et al. (Lidar Light Scattering Augmentation (LISA): Physics-based Simulation of Adverse Weather Conditions for 3D Object Detection, arXiv, Jul. 2021, pp. 1-12) (Year: 2021).*

Byeon et al. (Analysis of Automotive Lidar Sensor Model Considering Scattering Effects in Regional Rain Environments,2020, IEEE Access, pp. 102669-102679) (Year: 2020).*

* cited by examiner

TECHNIQUES FOR HEURISTICS-BASED SIMULATION OF ATMOSPHERIC EFFECTS IN AN AV SIMULATION SYSTEM

TECHNICAL FIELD OF THE DISCLOSURE

The present disclosure relates generally to autonomous vehicles (AVs) and, more specifically, to systems and methods for heuristics-based simulation of atmospheric effects, such as fog, in an AV simulation system.

BACKGROUND

An AV may be a vehicle that may be capable of sensing and navigating its environment with little or no user input. An autonomous vehicle may sense its environment using sensing devices such as Radio Detection and Ranging (RADAR), Light Detection and Ranging (LIDAR), image sensors, cameras, and the like. An autonomous vehicle system may also use information from a global positioning system (GPS), navigation systems, vehicle-to-vehicle communication, vehicle-to-infrastructure technology, and/or drive-by-wire systems to navigate the vehicle. As used herein, the phrase "autonomous vehicle" may include both fully autonomous and semi-autonomous vehicles.

BRIEF DESCRIPTION OF THE DRAWINGS

To provide a more complete understanding of the present disclosure and features and advantages thereof, reference may be made to the following description, taken in conjunction with the accompanying figures, wherein like reference numerals represent like parts, in which.

DESCRIPTION OF EXAMPLE EMBODIMENTS OF THE DISCLOSURE

Overview

A sensor for detecting atmospheric effects, such as fog, may be implemented in certain AVs. In particular, such a fog detection sensor may detect "speckle" or an atmospheric effect, which comprises points in space that do not appear to be associated with a solid object but instead correspond to a non-solid object. For example, if LIDAR beams are emitted in an empty room, the beams would hit the walls of the room. In contrast, if fog or another similar type of atmospheric effect comprising particulate matter (e.g., steam, mist, smoke, smog, etc.) were present in the room, some (likely small) portion of the emitted LIDAR beams would hit and bounce back from seemingly random spots in the middle of the air instead of striking and bouncing back from the walls. In one illustrative example, 1% of the LIDAR beams react sufficiently with a point in the fog to produce a point in a point cloud in seemingly random areas within the room. Such random points in the air are considered speckle because there are not enough hits in the point cloud to be associated with any object.

In accordance with features of embodiments described herein, to simulate fog or other atmospheric effects comprising particulate matter, such as listed above, a simulation module randomly selects a certain percentage of LIDAR beams to stop short in the air (i.e., stop short and reflect, or bounce, back) at a distance between a specified minimum distance and a specified maximum distance. The randomness accounts for both direction and distance as the LIDAR beam makes a 360 degree sweep. Different percentages of random return can account for different types of atmospheric effects. For example, in one embodiment, 2-3% (selected based on real-world sensor data) of random hits are selected to simulate fog, while other percentages may be used to simulate other atmospheric effects, such as steam, mist, smoke, etc. Additionally, the percentages of random hits can be adjusted to account for denser (a higher percentage of random hits are selected) and less dense (a lower percentage of random hits are selected) atmospheric effects. As described above, simulation of atmospheric effects can be accomplished by randomly (in both direction and distance) selecting particular points for reflection hits.

As will be appreciated by one skilled in the art, aspects of the present disclosure may be embodied in various manners (e.g., as a method, a system, a computer program product, or a computer-readable storage medium). Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g., one or more microprocessors, of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g., to the existing perception system devices or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference may be made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing or a subset of the elements illustrated in a drawing. Further, some embodiments can incorporate any suitable combination of features from two or more drawings.

Other features and advantages of the disclosure will be apparent from the following description and the claims.

As described herein, one aspect of the present technology may be the gathering and use of data available from various sources to improve quality and experience. The present disclosure contemplates that in some instances, this gathered data may include personal information. The present disclosure contemplates that the entities involved with such personal information respect and value privacy policies and practices.

The following disclosure describes various illustrative embodiments and examples for implementing the features and functionality of the present disclosure. While particular components, arrangements, or features are described below in connection with various example embodiments, these are merely examples used to simplify the present disclosure and are not intended to be limiting. It will of course be appreciated that in the development of any actual embodiment, numerous implementation-specific decisions must be made to achieve the developer's specific goals, including compliance with system, business, or legal constraints, which may vary from one implementation to another. Moreover, it will be appreciated that, while such a development effort might be complex and time-consuming; it would nevertheless be a routine undertaking for those of ordinary skill in the art having the benefit of this disclosure.

In the Specification, reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as "above", "below", "upper", "lower", "top", "bottom", or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction. When used to describe a range of dimensions or other characteristics (e.g., time, pressure, temperature, length, width, etc.) of an element, operations, or conditions, the phrase "between X and Y" represents a range that may include X and Y.

In addition, the terms "comprise," "comprising," "include," "including," "have," "having" or any other variation thereof, are intended to cover a non-exclusive inclusion. For example, a method, process, device, or system that comprises a list of elements may be not necessarily limited to only those elements but may include other elements not expressly listed or inherent to such method, process, device, or system. Also, the term "or" refers to an inclusive or and not to an exclusive or.

As used herein, the term "atmospheric effect" may refer to a collection of particles, or particulate matter, suspended in the atmosphere that are of similar size and composition but that may not be in physical contact with one another. Examples of atmospheric effects may include, but are not limited to, fog, steam, mist, smoke, smog, rain, etc. The term "fog" as used herein may be used illustratively to refer to all types of atmospheric effects. In particular, where the term "fog" is used as a modifier for component or device (e.g., "fog detector model"), it will be recognized that another type of atmospheric effect (or the phrase "atmospheric effect") may be substituted for fog without departing from the spirit or scope of embodiments described herein.

In the drawings, a particular number and arrangement of structures and components are presented for illustrative purposes and any desired number or arrangement of such structures and components may be present in various embodiments. Further, the structures shown in the figures may take any suitable form or shape according to material properties, fabrication processes, and operating conditions. For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 110a-110e), such a collection may be referred to herein without the letters (e.g., as "110").

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

The systems, methods and devices of this disclosure each have several innovative aspects, no single one of which may be solely responsible for all of the desirable attributes disclosed herein. Details of one or more implementations of the subject matter described in this Specification are set forth in the description below and the accompanying drawings.

Example AV Environment

Figure 1:
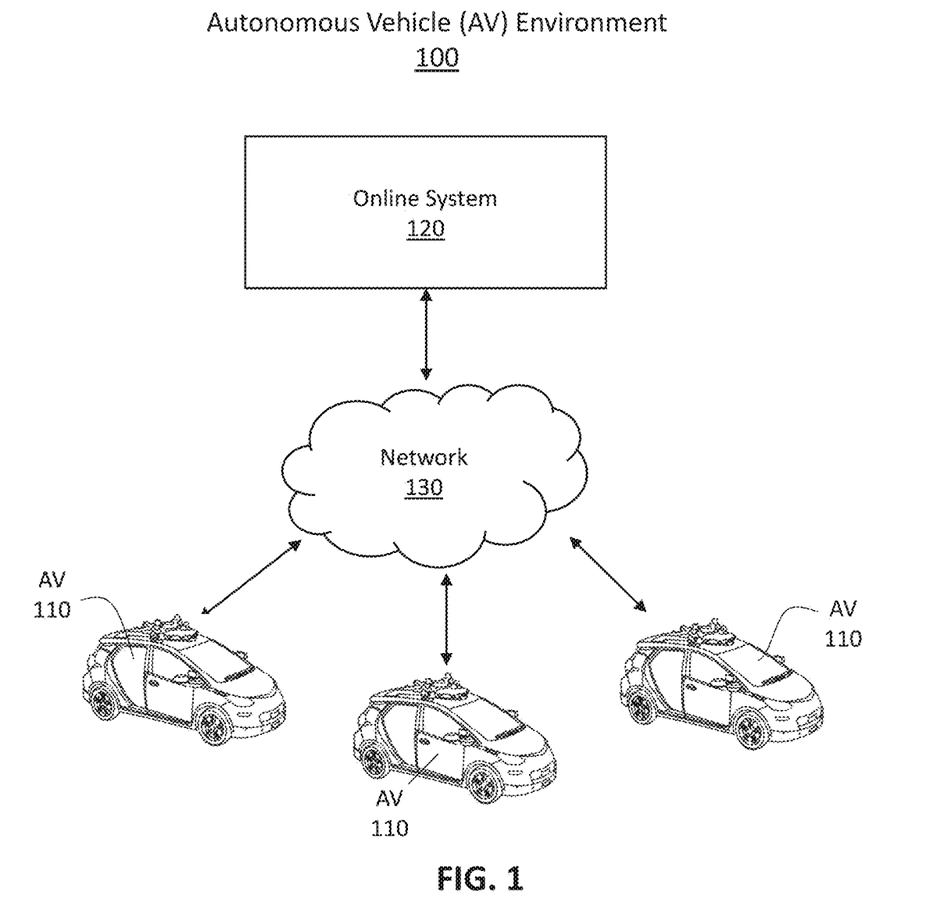
FIG. 1 shows an AV environment according to some embodiments of the present disclosure.

FIG. 1 shows an AV environment 100 according to some embodiments of the present disclosure. The AV environment 100 may include AVs 110 and an online system 120 in communication with the AVs 110 through a network 130. In other embodiments, the AV environment 100 may include fewer, more, or different components. For instance, the AV environment 100 may include a different number of AVs. A single AV may be referred to herein as AV 110, and multiple AVs are referred to collectively as AVs 110.

An AV 110 may be a vehicle that may be capable of sensing and navigating its environment with little or no user input. The AV 110 may be a semi-autonomous or fully autonomous vehicle, e.g., a boat, an unmanned aerial vehicle, a driverless car, etc. Additionally, or alternatively, the AV 110 may be a vehicle that switches between a semi-autonomous state and a fully autonomous state and thus, the AV may have attributes of both a semi-autonomous vehicle and a fully autonomous vehicle depending on the state of the vehicle. The AV 110 may include a throttle interface that controls an engine throttle, motor speed (e.g., rotational speed of electric motor), or any other movement-enabling mechanism; a brake interface that controls brakes of the AV (or any other movement-retarding mechanism); and a steering interface that controls steering of the AV (e.g., by changing the angle of wheels of the AV). The AV 110 may additionally or alternatively include interfaces for control of any other vehicle functions; e.g., windshield wipers, headlights, turn indicators, air conditioning, etc.

An AV 110 may include an onboard sensor suite that detects objects in the surrounding environment of the AV 110 and generates sensor data describing the objects. Examples of the objects include people, buildings, trees, traffic signs, other vehicles, landmarks, street markers, and so on. The onboard sensor suite may generate sensor data of the objects. The sensor data of the objects may include images, depth information, location information, or other types of sensor data. The onboard sensor suite may include various types of sensors. In some embodiments, the onboard sensor suite may include a computer vision ("CV") system, localization sensors, and driving sensors. For example, the onboard sensor suite may include photodetectors, cameras, RADAR, Sound Navigation and Ranging (SONAR), LIDAR, GPS, wheel speed sensors, inertial measurement units (IMUS), accelerometers, microphones, strain gauges, pressure monitors, barometers, thermometers, altimeters, ambient light sensors, etc. The sensors may be located in various positions in and around the AV 110.

The AV 110 may also include an onboard controller. The onboard controller controls operations and functionality of the AV 110. In some embodiments, the onboard controller may be a general-purpose computer, but may additionally or alternatively be any suitable computing device. The onboard controller may be adapted for I/O communication with other components of the AV 110 (e.g., the onboard sensor suite, etc.) and external systems (e.g., the online system 120). The onboard controller may be connected to the Internet via a wireless connection (e.g., via a cellular data connection). Additionally or alternatively, the onboard controller may be coupled to any number of wireless or wired communication systems.

The onboard controller may process sensor data generated by the onboard sensor suite and/or other data (e.g., data received from the online system 120) to determine the state of the AV 110. In some embodiments, the onboard controller implements an autonomous driving system (ADS) for controlling the AV 110 and processing sensor data from the onboard sensor suite and/or other sensors in order to determine the state of the AV 110. For instance, the onboard controller may input the sensor data into a classification model to identify objects detected by the onboard sensor suite. The onboard controller may receive the classification model from a different system, e.g., the online system 120. Based upon the output of the classification model, vehicle state, or programmed instructions, the onboard controller can modify or control the behavior of the AV 110. For instance, the onboard controller can use the output of the classification model to localize or navigate the AV 110. More information of the onboard controller is described below in conjunction with FIG. 2.

An AV 110 may also include a rechargeable battery that powers the AV 110. The battery may be a lithium-ion battery, a lithium polymer battery, a lead-acid battery, a nickel-metal hydride battery, a sodium nickel chloride ("zebra") battery, a lithium-titanate battery, or another type of rechargeable battery. In some embodiments, the AV 110 may be a hybrid electric vehicle that may also include an internal combustion engine for powering the AV 110, e.g., when the battery has low charge. In some embodiments, the AV 110 may include multiple batteries, e.g., a first battery used to power vehicle propulsion, and a second battery used to power AV hardware (e.g., the onboard sensor suite and the onboard controller). The AV 110 may further include components for charging the battery, e.g., a charge port configured to make an electrical connection between the battery and a charging station.

The online system 120 can support the operation of the AVs 110. In some embodiments, the online system 120 may manage a service that provides or uses the AVs 110, e.g., a service for providing rides to users with the AVs 110, or a service that delivers items using the AVs (e.g., prepared foods, groceries, packages, etc.). The online system 120 may select an AV from a fleet of AVs 110 to perform a particular service or other task. The online system 120 may instruct the selected AV 110 to autonomously drive to a particular location (e.g., a delivery address). The online system 120 may also manage fleet maintenance tasks, such as charging and servicing of the AVs 110.

In some embodiments, the online system 120 may also provide the AV 110 (and particularly, onboard controller) with system backend functions. The online system 120 may include one or more switches, servers, databases, live advisors, or an automated voice response system (VRS). The online system 120 may include any or all of the aforementioned components, which may be coupled to one another via a wired or wireless local area network (LAN). The online system 120 may receive and transmit data via one or more appropriate devices and network from and to the AV 110, such as by wireless systems, such as 882.11x, GPRS, and the like. A database at the online system 120 can store account information such as subscriber authentication information, vehicle identifiers, profile records, behavioral patterns, and other pertinent subscriber information. The online system 120 may also include a database of roads, routes, locations, etc. permitted for use by AV 110. The online system 120 may communicate with the AV 110 to provide route guidance in response to a request received from the vehicle.

Figure 3A:
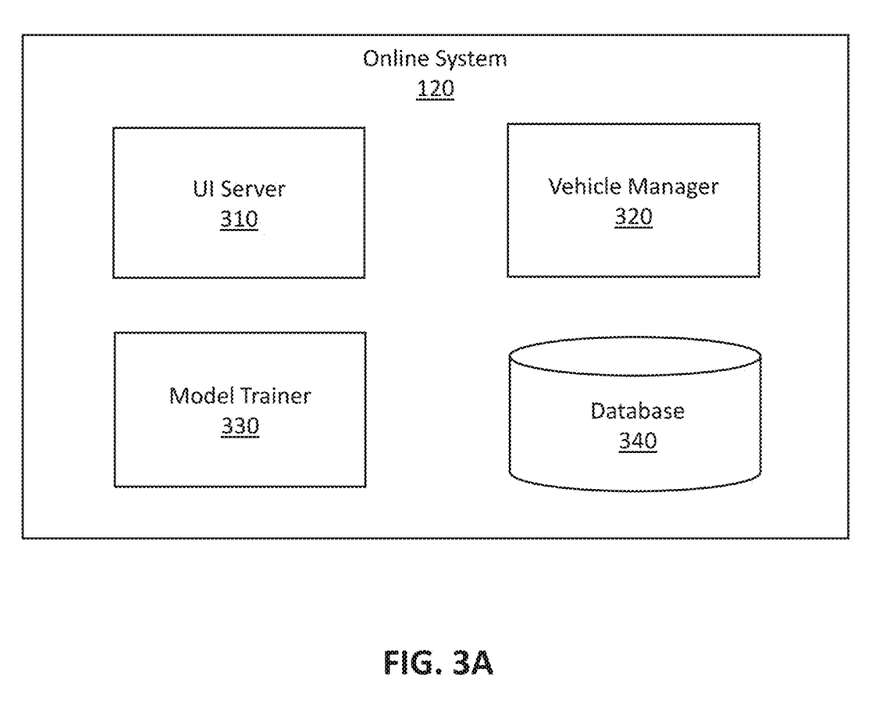
FIGS. 3A and 3B are block diagrams illustrating an online system according to some embodiments of the present disclosure.

For example, based upon information stored in a mapping system of the online system 120, the online system 120 may determine the conditions of various roads or portions thereof. The AV 110, may, in the course of determining a navigation route, receive instructions from the online system 120 regarding which roads or portions thereof, if any, are appropriate for use under certain circumstances, as described herein. Such instructions may be based in part on information received from the AV 110 or other autonomous vehicles regarding road conditions. Accordingly, the online system 120 may receive information regarding the roads/routes generally in real-time from one or more vehicles. More details of the online system 120 are provided below in conjunction with FIG. 3.

The network 130 can support communications between an AV 110 and the online system 120. The network 130 may comprise any combination of local area and/or wide area networks, using both wired and/or wireless communication systems. In one embodiment, the network 130 may use standard communications technologies and/or protocols. For example, the network 130 may include communication links using technologies such as Ethernet, 802.11, worldwide interoperability for microwave access (WiMAX), 3G, 4G, code division multiple access (CDMA), digital subscriber line (DSL), etc. Examples of networking protocols used for communicating via the network 130 may include multiprotocol label switching (MPLS), transmission control protocol/Internet protocol (TCP/IP), hypertext transport protocol (HTTP), simple mail transfer protocol (SMTP), and file transfer protocol (FTP). Data exchanged over the network 130 may be represented using any suitable format, such as hypertext markup language (HTML) or extensible markup language (XML). In some embodiments, all or some of the communication links of the network 130 may be encrypted using any suitable technique or techniques.

Example Onboard Controller

Figure 2:
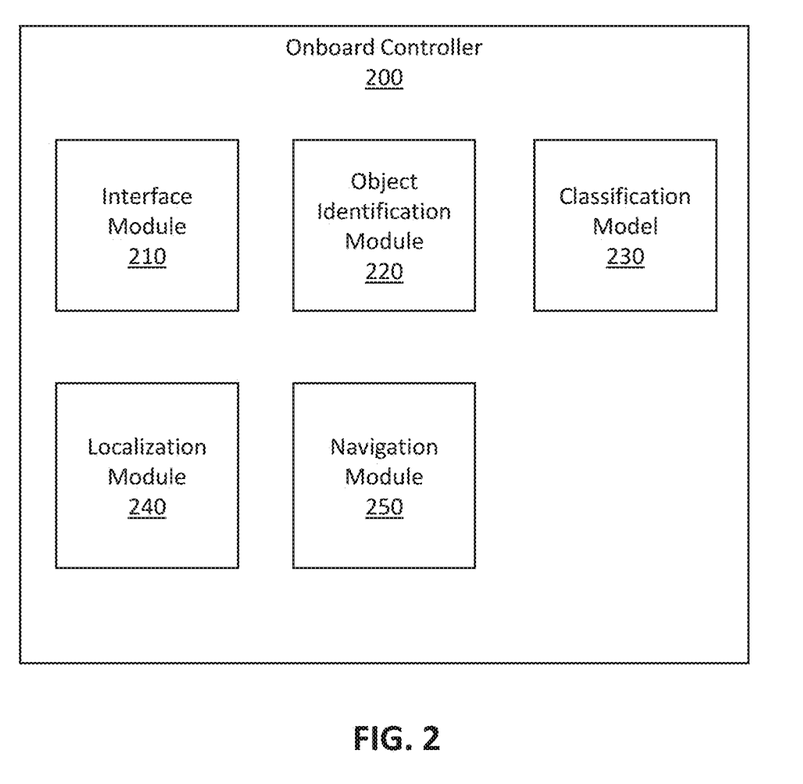
FIG. 2 is a block diagram illustrating an onboard controller of an AV according to some embodiments of the present disclosure.

FIG. 2 is a block diagram illustrating an onboard controller 200 of an AV 110 according to some embodiments of the present disclosure. The onboard controller 200 may include an interface module 210, an object identification module 220, a classification model 230, a localization module 240, and a navigation module 250. Alternative configurations, including different or additional components may be included in the onboard controller 200. Further, functionality attributed to one component of the onboard controller 200 may be accomplished by a different component included in the onboard controller 200, the AV 110, or a different system, e.g., the online system 120.

The interface module 210 can facilitate communications of the onboard controller 200 with other systems. For instance, the interface module 210 may support communications of the onboard controller 200 with the online system 120. The interface module 210 may also facilitate communications of the onboard controller 200 with other components of the AV 110, e.g., the onboard sensor suite. For instance, the interface module 210 may retrieve sensor data generated by the onboard sensor suite, and so on.

The object identification module 220 can use the classification model 230 to determine categories of objects. The classification model 230 may be a real-world model trained by using data collected from a real-world scene and/or a simulated model trained by using data collected from a simulated scene. The object identification module 220 may input sensor data of the objects into the classification model 230. The classification model 230, receiving the sensor data, can output the categories of the objects. The sensor data of the objects may include sensor data generated by the onboard sensor suite of the AV 110, such as images, depth information, location information, etc. The sensor data of the objects may include data received from the online system 120 or a sensor external to the AV 110.

The localization module 240 can localize the AV 110. In some embodiments, the localization module 240 determines where the AV is, e.g., whether the AV 110 has arrived at a predetermined location (e.g., a destination of a delivery service). For instance, the localization module 240 may determine the location of the AV 110. The localization module 240 may further compare the location of the AV 110 with the predetermined location to determine whether the AV 110 has arrived. The localization module 240 can further localize the AV 110 with respect to a site or an object. For instance, the localization module 240 can determine a pose (position or orientation) of the AV 110 in the site. The localization module 240 can also determine a pose of the AV 110 with respect to an object in the site.

The localization module 240 may use sensor data generated by the onboard sensor suite to determine where the AV 110 is. The sensor data may include information describing an absolute or relative position of the AV 110 (e.g., data generated by GPS, GNSS, IMU, etc.), information describing features surrounding the AV 110 (e.g., data generated by a camera, RADRA, SONAR, LINAR, etc.), information describing motion of the AV 110 (e.g., data generated by the motion sensor), or some combination thereof. Additionally or alternatively, the localization module 240 may use objects identified by the object identification module 220 to localize the AV 110. For instance, the localization module 240 uses the identification of an object to determine whether the AV 110 has arrived at a location associated with the object.

The navigation module 250 can control the motion of the AV 110. The navigation module 250 may control the motor of the AV 110 to start, pause, resume, or stop motion of the AV 110. The navigation module 250 may further control the wheels of the AV 110 to control the direction the AV 110 will move. In various embodiments, the navigation module 250 generates a navigation route for the AV 110 based on a location of the AV 110, a destination, and a map. The navigation module 250 may receive the location of the AV 110 from the localization module 240. The navigation module 250 may receive a request to go to a location and generate a route to navigate the AV 110 from its current location, which may be determined by the localization module 240, to the location. The navigation module 250 may receive the destination through the interface module 210.

In some embodiments, the navigation module 250 can control the motion of the AV 110 based on object identification performed by the object identification module 220. The navigation module 250 may determine whether to stop or start of the motion of the AV 110 based on the identification of one or more objects in the vicinity of the AV 110. In an example where the object identification module 220 identifies a stop sign in the vicinity of the AV 110, the navigation module 250 can stop the motion of the AV 110. The navigation module 250 may determine or modify a navigation route for the AV 110 based on the identification of one or more objects in the vicinity of the AV 110. For instance, after the object identification module 220 identifies a tree in the vicinity of the AV 110, the navigation module 250 may control the AV 110 to navigate around the tree. The navigation module 250 may also determine or modify a motion speed of the AV 110 based on the identification of objects in the vicinity of the AV 110 the AV 110. The navigation module 250 may further change a pose of the AV 110 based on the identification of objects in the vicinity of the AV 110 the AV 110.

In some embodiments, the navigation module 250 can control the motion of the AV 110 based on detection of an atmospheric effect in the vicinity of the AV 110. The navigation module 250 may determine whether to stop or start motion of the AV 110 based on the detection of an atmospheric effect in the vicinity of the AV 110. The navigation module 250 may determine or modify a navigation route for the AV 110 based on the detection of an atmospheric effect in the vicinity of the AV 110. The navigation module 250 may also determine or modify a motion speed of the AV 110 based on the detection of an atmospheric effect in the vicinity of the AV 110 the AV 110. The navigation module 250 may further change a pose of the AV 110 based on the detection of an atmospheric effect in the vicinity of the AV 110.

Example Online System

FIG. 3A is a block diagram illustrating the online system 120 according to some embodiments of the present disclosure. The online system 120 may include a UI server 310, a vehicle manager 320, a model trainer 330, and a database 340. Alternative configurations, including different or additional components may be included in the online system 120. Further, functionality attributed to one component of the online system 120 may be accomplished by a different component included in the online system 120 or a different system, e.g., the onboard controller 200.

The UI server 310 may be configured to communicate with third-party devices that provide a UI to users. For example, the UI server 310 may be a web server that provides a browser-based application to third-party devices, or the UI server 310 may be a mobile app server that interfaces with a mobile app installed on third-party devices. The UI enables the user to access a service of the online system 120, e.g., to request a delivery by using an AV 110.

The vehicle manager 320 manages and communicates with a fleet of AVs, e.g., the AVs 110 in FIG. 1. The vehicle manager 320 may assign AVs 110 to various tasks and direct the movements of the AVs 110 in the fleet. For example, the vehicle manager 320 assigns an AV 110 to perform a delivery service requested by a user through the UI server 310. The vehicle manager 320 may instruct AVs 110 to drive to other locations while not servicing a user, e.g., to improve geographic distribution of the fleet, to anticipate demand at particular locations, to drive to a charging station for charging, etc. The vehicle manager 320 also instructs AVs 110 to return to AV facilities for recharging, maintenance, or storage.

The model trainer 330 can train one or more models to be used by AVs 110 to identify objects. The model trainer 330 may utilize a simulated scene that may include simulated objects and atmospheric effects generated based on real-world objects in a real-world scene. In an embodiment, each simulated object may be a virtual object and represent one of the real-world objects.

The model trainer 330 may also simulate navigation of an AV 110 in the simulated scene, e.g., by generating a virtual AV that simulates the AV 110 and navigating the virtual AV in the simulated scene. The virtual AV may navigate along a route in the vicinity of the virtual objects and provide simulated sensor data generated by the onboard sensor suite of the virtual AV. The model trainer 330 can form a training set by including the data of the virtual objects and the labels of the virtual objects.

The database 340 can store data used, generated, received, or otherwise associated with the online system 120. The database 340 may store models generated by the model trainer 330. The database 340 may also store data associated with the AVs 110, data received from third-party systems, and so on.

Figure 3B:
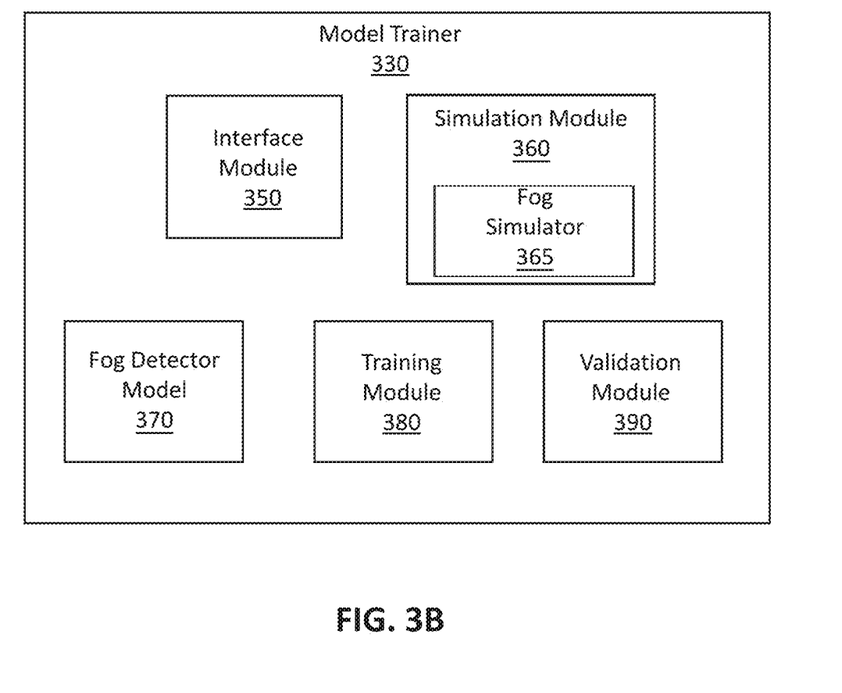

FIG. 3B is a block diagram illustrating the model trainer 330 of the online system 120 according to some embodiments of the present disclosure. The model trainer 330 in FIG. 3B may include an interface module 350, a simulation module 360 including a fog simulator 365, a fog detector (or LIDAR) model 370, a training module 380, and a validation module 390.

The interface module 350 can facilitate communications of the model trainer 330 with other systems. For instance, the interface module 350 may support communications of the model trainer 330 with the other components of the online system 120. The interface module 210 may also facilitate communications of the model trainer 330 with other components of the AV 110, e.g., the onboard sensor suite. For instance, the interface module 350 may receive a simulated scene from the database 340. As another example, the interface module 350 may receive sensor data generated by the onboard sensor suite, and so on.

The simulation module 360 can generate simulated scenes. The simulation module 360 may generate a simulated scene based on a real-world scene, e.g., a city or a district in a city. In some embodiments, the simulation module 360 may identify real-world objects in the real-world scene. The real-world objects may include people, buildings, street marks (e.g., curbs, lane markers, etc.), traffic signs, trees, landmarks, or other types of objects that can be present in the real-world scene. The simulation module 360 may generate a simulated object for each identified real-world object (or each of a subset of the identified real-world objects). The simulated object may be a virtual object representing the corresponding real-world object. The simulation module 360 may further combine the simulated objects to generate the simulated scene. Accordingly, the simulated scene can be a virtual representation of the real-world scene.

The simulation module 360 may label the simulated objects. For instance, the simulation module 360 may generate a label for each simulated object based on the known category of the simulated object. The label may describe the category of the simulated object. The simulation module 360 may also generate a simulated AV, which is a virtual AV that simulates an AV 110. The simulation module 360 may place the virtual AV in the simulated scene. The simulated AV can navigate in the simulated scene. The simulated AV may include a simulated onboard sensor suite that simulates the onboard sensor suite of the AV 110. The virtual onboard sensor suite can detect objects in the surrounding environment of the simulated AV. For instance, the simulated onboard sensor suite may generate simulated sensor data of the simulated objects, e.g., images, audio, depth information (e.g., point clouds), location information, and so on. In certain embodiments, the virtual onboard sensor suite may include a virtual fog detector implemented using a virtual LIDAR sensor, for example.

The reference classification model may be a real-world model or simulated model. The real-world model is a classification model trained by using sensor data of real-world objects, e.g., sensor data generated by an onboard sensor suite of an AV 110 navigating in a real-world scene where the real-world objects are located. The real-world scene used for training the real-world model and the real-world scene used for generating the simulated scene may be the same scene. For example, the real-world model may be trained by data collected from San Francisco and the simulated scene is generated to simulate San Francisco. As another example, the real-world model may be trained by data collected from San Francisco but the simulated scene is generated to simulate Phoenix. The simulated model is a classification model trained by using simulated sensor data of simulated objects collected from a simulated scene representing a real-world scene. The simulated scene used for training the simulated model and the simulated scene generated by the simulation module 360 may be the same.

The training module 380 can train the fog detector model 370 by using the simulated scene. The training module 380 applies machine learning techniques to generate the fog detector model 370 that when applied to sensor data of objects outputs sensor data that is representative of real world sensor data. As part of the generation of the fog detector model 370, the training module 380 forms a training set. The training set may include the sensor data of one or more simulated objects and the labels of the simulated objects.

The training module 380 may extract feature values from the training set, the features being variables deemed potentially relevant to classification of the simulated objects. The feature values extracted by the training module 380 may include, e.g., shape, size, color, pattern, material, or other types of attributes of the objects. An ordered list of the features for an object may be herein referred to as the feature vector for the object. In one embodiment, the training module 380 may apply dimensionality reduction (e.g., via linear discriminant analysis (LDA), principal component analysis (PCA), or the like) to reduce the amount of data in the feature vectors to a smaller, more representative set of training data.

The training module 380 may use supervised machine learning to train the classification model, with the feature vectors of the training set serving as the inputs. Different machine learning techniques—such as linear support vector machine (linear SVM), boosting for other algorithms (e.g., AdaBoost), neural networks (e.g., convolutional neural network), logistic regression, naïve Bayes, memory-based learning, random forests, bagged trees, decision trees, boosted trees, or boosted stumps—may be used in different embodiments.

In some embodiments, the training module 380 may train the fog detector model 370 by modifying a simulated model or real-world model. For instance, the training module 380 may re-train the simulated model or real-world model by using additional data to create the fog detector model 370. In some embodiments, the training module 380 may continuously train the fog detector model 370 using new training data. The validation module 390 can validate a performance of the fog detector model 370 in simulating real world fog detection data. In some embodiments, the accuracy of the fog detector model 370 may be quantified as a score and compared with a threshold score. In an example in which the validation module 390 determines that the accuracy score of the fog detector model 370 is lower than the threshold score (or the accuracy score of a reference model), the validation module 390 may instruct the training module 380 to re-train the fog detector model 370. In one embodiment, the training module 380 may iteratively re-train the fog detector model 370 until the occurrence of a stopping condition, such as an indication by the accuracy score that the fog detector model 370 may be sufficiently accurate, or a number of training rounds having taken place.

Example Simulated Scenes

Figure 4:
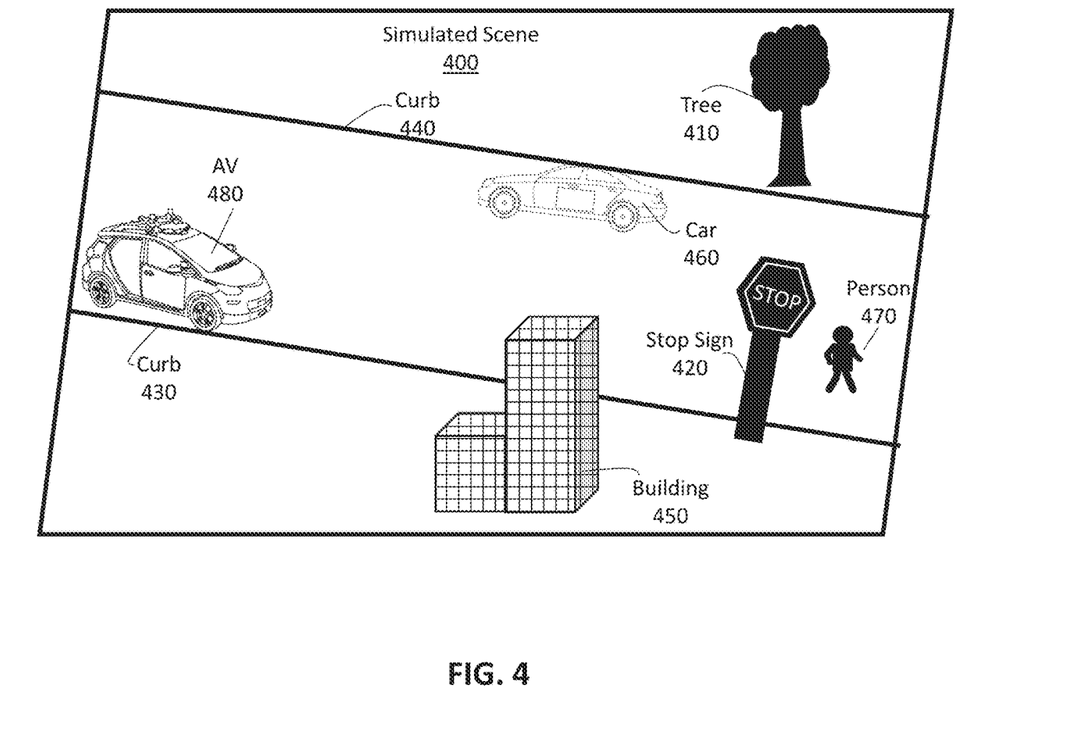
FIG. 4 illustrates a simulated scene according to some embodiments of the present disclosure.

FIG. 4 illustrates a simulated scene 400 according to some embodiments of the present disclosure. The simulated scene 400 may be generated by the simulation module 360 in FIG. 3B. The simulated scene 400 is a virtual representation of a real-world scene. In FIG. 4, the simulated scene 400 may include a plurality of virtual objects: a virtual tree 410, a virtual stop sign 420, a virtual curb 430, another virtual curb 440, a virtual building 450, a virtual car 460, and a virtual person 470. Additionally, the simulated scene 400 may include a simulated AV 480, which may be a virtual representation of a real-world AV, e.g., the AV 110. The simulated AV 480 may have a simulated onboard sensor suite that detects objects in the surrounding environment of the simulated AV 480. The simulated onboard sensor suite may be a virtual representation of the onboard sensor suite of an AV 110 described above. The simulated AV 480 may also have a simulated onboard controller that is a virtual representation of the onboard controller 200. The simulated AV 480 may also navigate in the simulated scene 400.

In other embodiments, the simulated scene 400 may include different, more, or fewer virtual objects. Each of the virtual objects may be a virtual representation of a real-world object in the real-world scene. In some embodiments, the real-world scene may include real-world objects that are not represented by any of the virtual objects in the simulated scene 400. The simulated scene 400 can be used to train a simulated model.

Figure 5A:
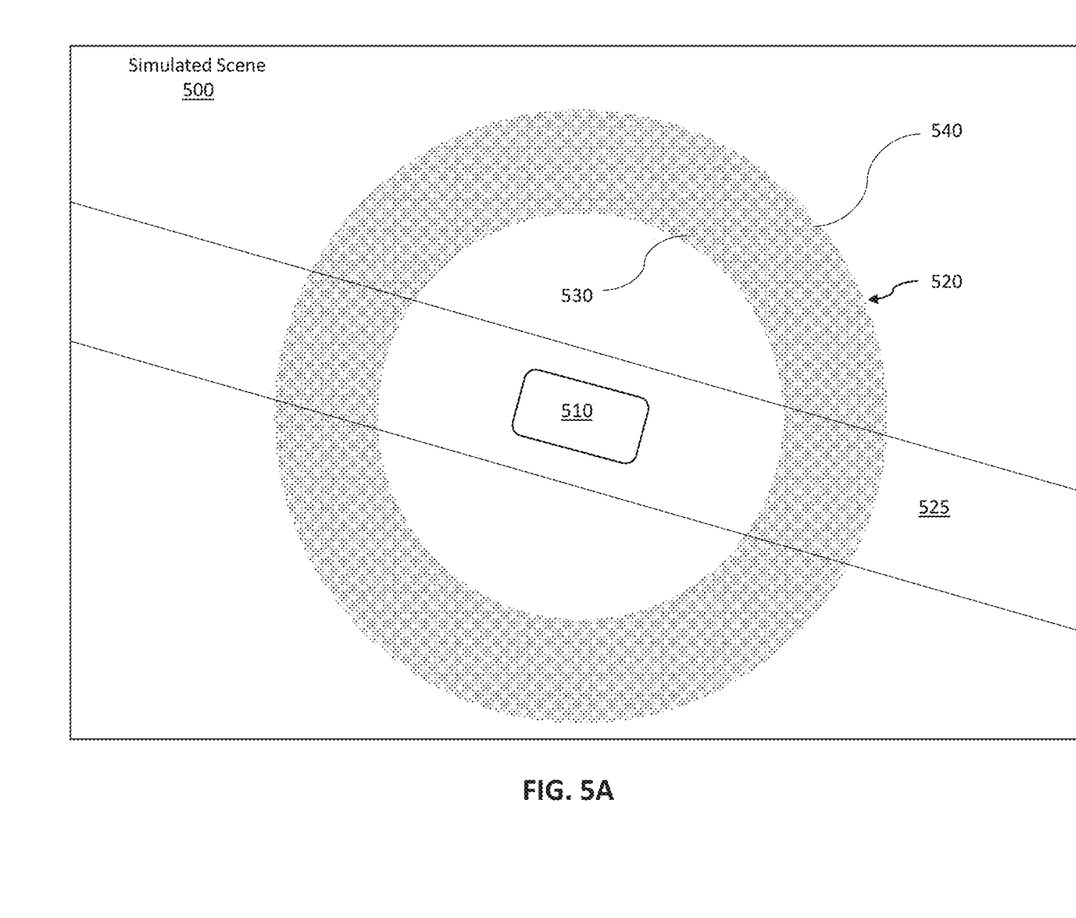
FIGS. 5A and 5B illustrate additional simulated scenes representing atmospheric effects according to some embodiments of the present disclosure.

FIG. 5A illustrates another example simulated scene 500 according to some embodiments of the present disclosure for heuristics-based fog simulation. The simulated scene 500 may be generated by the simulation module 360 using the fog simulator 365 in FIG. s3B. The simulated scene 500 is a virtual representation of a real-world scene in which a simulated AV 510, which may be a virtual representation of a real-world AV, e.g., the AV 110, is surrounded by fog, which is virtually represented in the simulated scene by a ring 520 of randomly selected points around the AV 510. In operation, a subset of the randomly selected points comprises simulated sensor points representing a "speckled" LIDAR beam or ray; i.e., a beam or ray that seemingly stops short in the air and is reflected back to the LIDAR without hitting another object.

It will be recognized that other virtual objects that may comprise the scene 500 are not illustrated for purposes of clarity and simplicity. The simulated AV 510 may have a simulated onboard sensor suite that detects objects in the surrounding environment of the simulated AV 510. The simulated onboard sensor suite may be a virtual representation of the onboard sensor suite of an AV 110 described above. In one embodiment, the simulated onboard sensor suite may include a fog detector, which may be implemented using a LIDAR detector. The simulated AV 510 may also have a simulated onboard controller that is a virtual representation of the onboard controller 200. The simulated AV 510 may also navigate in the simulated scene 500 on a virtual road 525.

A distance (e.g., in meters) between the virtual LIDAR of the AV 510 and an inner surface 530 of the ring 520 of points corresponds to a "minimum speckle distance" and a distance (e.g., in meters) between the virtual LIDAR of the AV 510 and an outer surface 540 of the ring 520 of points corresponds to a "maximum speckle distance." A density of points in the ring 520 may correspond to a "speckle probability." Intensity of the points of the ring 520 lies between a minimum speckle intensity and a maximum speckle intensity.

It will be recognized that other virtual objects that may comprise the scene 500 are not illustrated for purposes of clarity and simplicity. The simulated AV 510 may have a simulated onboard sensor suite that detects objects in the surrounding environment of the simulated AV 510.

In some embodiments, the simulated scene 500 may include virtual objects that may be a virtual representation of a real-world object in the real-world scene. In some embodiments, the real-world scene may include real-world objects that are not represented by any of the virtual objects in the simulated scene. The simulated scene 500 can be used to train a simulated model; e.g., a fog detector model.

Figure 5B:
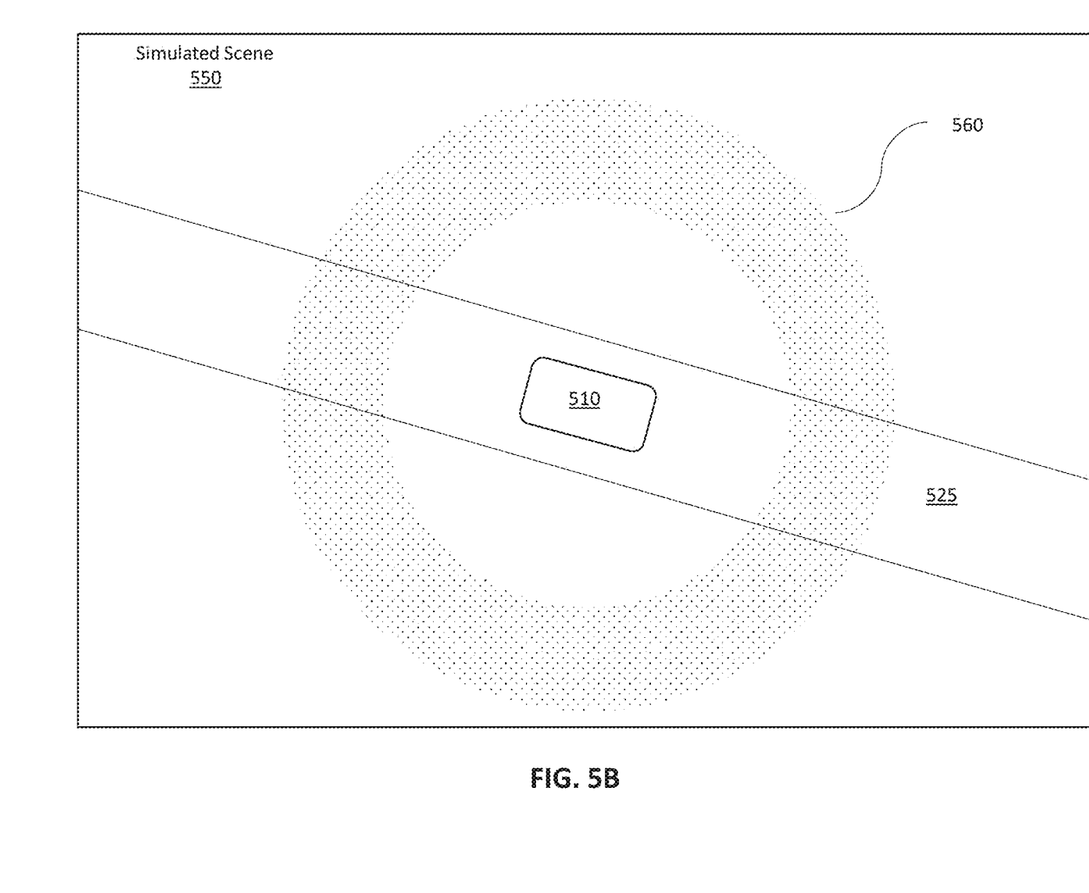

FIG. 5B illustrates yet another simulated scene 550 according to some embodiments of the present disclosure for heuristics-based fog simulation. The simulated scene 550 may be generated by the simulation module 360 using the fog simulator 365 in FIG. 3B. The simulated scene 550 is a virtual representation of a real-world scene in which a simulated AV 510, which may be a virtual representation of a real-world AV, e.g., the AV 110, is surrounded by fog, which is virtually represented in the simulated scene by a ring 560 of randomly selected points around the AV 510. As illustrated in FIG. 5B, simulated fog represented by the ring 560 is less dense (i.e., comprises fewer random points) than the ring 520.

It will be recognized that while rings 520 and 560 are described as representing fog in simulated scenes 500 and 550, respectively, one or both may alternatively represent other atmospheric effects that may be modeled by random points, such as steam, mist, smoke, etc. Additionally, while random points are shown as comprising complete rings (e.g., rings 520, 560), it will be recognized that in other embodiments, the collection of random points for representing an atmospheric effect may comprise only one or more portions of a ring and each such portion may be the same or different sizes than other ones of the portions and may have the same or different densities as other ones of the portions as may be defined by various speckle parameters. Additionally, the collection of random points for representing an atmospheric effect may include a shape other than a ring or portion of a ring and/or may comprise a more arbitrary shape that may be described as one or more of regular, irregular, symmetrical, or asymmetrical.

Example Processes for Heuristics-Based Fog Simulation

Figure 6:
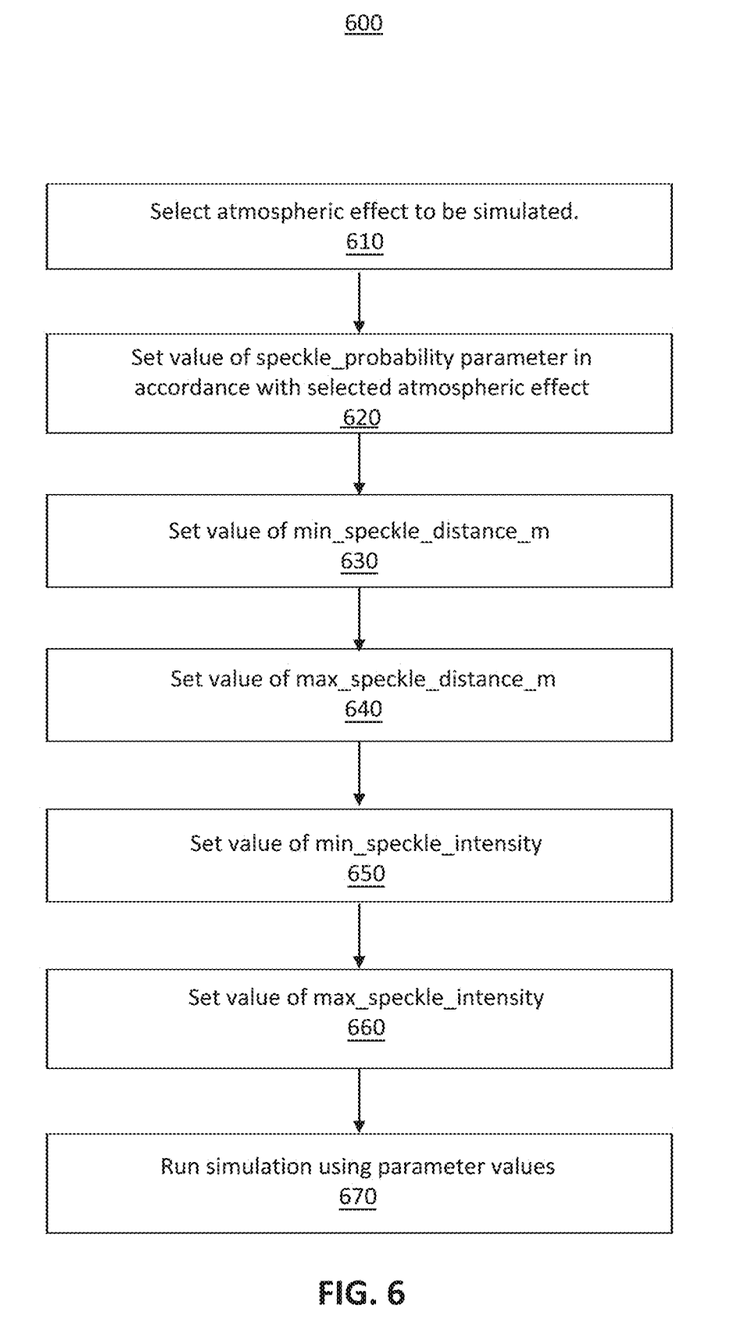
FIG. 6 is a flowchart showing a method of simulating atmospheric effects in an AV simulation system according to some embodiments of the present disclosure.

FIG. 6 is a flowchart showing a method 600 of simulating atmospheric effects, such as fog, in an AV simulation system according to some embodiments of the present disclosure. In some embodiments, the method may be performed by the online system 120, such as the simulation module 360 and fog detector model 370 of the online system 120.

In step 610, a determination is made regarding what type of atmospheric effect is to be modeled in a simulated scene. As previously noted, example atmospheric effects that may be modeled include, but are not limited to, fog, steam, mist, smoke, etc.

In step 620, a speckle_probability parameter is set based on the type of atmospheric effect that is to be modeled in the simulated scene. In certain embodiments, the value of speckle_probability may be a float value between zero and one and designates the probability that a particular LIDAR beam will be speckled (i.e., will hit one of the "particles" and reflect back to the sensor). The value of the speckle_probability parameter corresponds to a density of points to be generated for representing the atmospheric effect. For example, the value of the speckle_probability parameter for dense fog may be 0.03 (or 3% of random points generated), whereas the value of the speckle_probability parameter for less dense fog may be 0.01 (or 1% of random points generated). In another example, the value of the speckle_probability parameter for heavy rain may be 0.05 (or 5% of random points generated), whereas the value of the speckle_probability parameter for light rain may be 0.01 (or 1% of random points generated).

In step 630, a value for a min_speckle_distance_m parameter is specified. The min_speckle_distance_m parameter corresponds to a distance (in meters) from the virtual LIDAR to the closest point of the collection of points representing the atmospheric effect being modeled (e.g., inner surface 530 of the ring 520 (FIG. 5A)). In certain embodiments, the value of min_speckle_distance_m may be zero (such as would be the case when the AV moving through the fog) or a positive float value.

In step 640, a value for a max_speckle_distance_m parameter is specified. The max_speckle_distance_m parameter corresponds to a distance (in meters) from the virtual to the most distant point of the collection of points representing the atmospheric effect being modeled (e.g., outer surface 540 of the ring 520 (FIG. 5A)). In certain embodiments, the value of max_speckle_distance_m may be a positive float value.

In step 650, a value for a min_speckle_intensity parameter is specified. The min_speckle_intensity parameter corresponds to the minimum LIDAR intensity of any one of the random points representing the atmospheric effect being modeled (e.g., points in the ring 520 (FIG. 5A)). In certain embodiments, the value of min_speckle_intensity may be an integer value between 0 and 255.

In step 660, a value for a max_speckle_intensity parameter is specified. The max_speckle_intensity parameter corresponds to the maximum LIDAR intensity of any one of the random points representing the atmospheric effect being modeled (e.g., points in the ring 520 (FIG. 5A)). In certain embodiments, the value of max_speckle_intensity may be an integer value between 0 and 255.

In step 670, during a simulation, the atmospheric effect may be simulated using the values specified for one or more of the foregoing parameters. In particular, during the simulation, a subset of points comprising the simulated representation of the atmospheric effect may be randomly selected (both in direction and distance) as hits/reflections to simulate the detection of the atmospheric effect by the simulated sensor as defined by the parameter values described above.

In certain embodiments, the simulation may be used to perform exposure testing of the AV in a simulated environment. In particular, the simulation may allow the capabilities of the AV to react to fog and other atmospheric effects to be determined using a stress test. In various embodiments, the method 600 may be implemented in one or more modules of the online system 120 and used to train AVs to react to various atmospheric effects in real world scenarios using simulated scenes.

Select Examples

Example 1 provides a method for simulating an atmospheric effect in a simulation system, the atmospheric effect including a plurality of particles suspended in an atmosphere, the method including receiving a first parameter defining a density of the plurality of particles including the atmospheric effect; receiving at least one second parameter defining a location of the atmospheric effect relative to a vehicle in a scene generate by the simulation system; and simulating the atmospheric effect in the scene as defined by the first parameter and the at least one second parameter.

Example 2 provides the method of example 1, where the simulation of the atmospheric effect may include a plurality of points in the scene.

Example 3 provides the method of example 2, where a density of the plurality of points is defined by the first parameter.

Example 4 provides the method of any of examples 1-3, where the simulation of the atmospheric effect may include a ring of points surrounding the vehicle, the ring having an inner surface and an outer surface.

Example 5 provides the method of example 4, where the at least one second parameter defines a distance from a sensor of the vehicle to the inner surface of the ring.

Example 6 provides the method of example 4, where the at least one second parameter defines a distance from a sensor of the vehicle to the outer surface of the ring.

Example 7 provides the method of example 2, where the at least one second parameter defines a minimum intensity of the plurality of points as detected by a sensor of the vehicle.

Example 8 provides the method of example 2, where the at least one second parameter defines a maximum sensor intensity of the plurality of points as detected by a sensor of the vehicle.

Example 9 provides the method of any of examples 1-8, further including receiving at least one third parameter defining a shape of the atmospheric effect.

Example 10 provides the method of example 9, where the shape may include a portion of a ring surrounding the vehicle.

Example 11 provides the method of example 10, where the shape may include multiple portions of a ring surrounding the vehicle.

Example 12 provides the method of any of examples 1-11, where the atmospheric effect may include at least one of fog, smog, smoke, mist, and steam.

Example 13 provides the method of any of examples 1-12, where the vehicle may include an autonomous vehicle (AV).

Example 14 provides a method for simulating an atmospheric effect in a simulation system, the atmospheric effect including a particulate matter, the method including emitting in the simulation system beams from a sensor associated with a vehicle; randomly selecting ones of the emitted beams to bounce back to the sensor at a distance a distance greater than a specified minimum distance from the sensor and less than a specified maximum distance from the sensor; and where the randomly selected ones of the emitted beams include a specified percentage of the emitted beams.

Example 15 provides the method of example 14, where the specified percentage of the emitted beams correspond to a density of the particulate matter of the atmospheric effect being simulated.

Example 16 provides the method of any of examples 14-15, where the sensor may include a light detection and ranging (LIDAR) device.

Example 17 provides the method of any of examples 14-16, where the beams are emitted in a 360 degree sweep around the vehicle.

Example 18 provides the method of any of examples 14-17, further including randomly assigning an intensity to each of the randomly selected ones of the beams, where the assigned intensity is greater than a specified minimum intensity and less than a specified maximum intensity.

Example 19 provides the method of any of examples 14-18, where the atmospheric effect may include at least one of fog, smog, smoke, mist, and steam.

Example 20 provides a computer-implemented system for simulating an atmospheric effect in a simulation system, the atmospheric effect including a plurality of atmospheric particles, the computer-implemented system including a processor and one or more non-transitory computer-readable media storing instructions that when executed by the processor cause the processor to perform operations including receiving a first parameter defining a density of the plurality of atmospheric particles including the atmospheric effect; receiving at least one second parameter defining a location of the atmospheric effect relative to a vehicle in a scene generate by the simulation system; and simulating the atmospheric effect in the scene as defined by the first parameter and the at least one second parameter.

Other Implementation Notes, Variations, and Applications

It may be to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

In one example embodiment, any number of electrical circuits of the figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

It may be also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more components. However, this has been done for purposes of clarity and example only. It should be appreciated that the system can be consolidated in any suitable manner. Along similar design alternatives, any of the illustrated components, modules, and elements of the figures may be combined in various possible configurations, all of which are clearly within the broad scope of this Specification.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it may be intended that the present disclosure encompass all such changes, substitutions, variations, alterations, and modifications as falling within the scope of the appended claims. Note that all optional features of the systems and methods described above may also be implemented with respect to the methods or systems described herein and specifics in the examples may be used anywhere in one or more embodiments.

In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph (f) of 35 U.S.C. Section 112 as it exists on the date of the filing hereof unless the words "means for" or "step for" are specifically used in the particular claims; and (b) does not intend, by any statement in the Specification, to limit this disclosure in any way that may be not otherwise reflected in the appended claims.

What is claimed is:

1. A method for simulating an atmospheric effect in a simulation system, the atmospheric effect comprising a plurality of particles suspended in an atmosphere, the method comprising:
receiving a first parameter defining a density of the plurality of particles comprising the atmospheric effect;
receiving at least one second parameter defining a location of the atmospheric effect relative to a vehicle in a scene generate by the simulation system; and simulating the atmospheric effect in the scene as defined by the first parameter and the at least one second parameter, wherein the simulation of the atmospheric effect comprises a ring of points surrounding the vehicle, the ring having an inner surface and an outer surface, and wherein the first and second parameters are used to dynamically adjust a distribution and intensity of the points within the ring to accurately represent varying atmospheric condition.

2. The method of claim 1, wherein the simulation of the atmospheric effect comprises a plurality of points in the scene.

3. The method of claim 2, wherein a density of the plurality of points is defined by the first parameter.

4. The method of claim 1, wherein the at least one second parameter defines a distance from a sensor of the vehicle to the inner surface of the ring.

5. The method of claim 1, wherein the at least one second parameter defines a distance from a sensor of the vehicle to the outer surface of the ring.

6. The method of claim 2, wherein the at least one second parameter defines a minimum intensity of the plurality of points as detected by a sensor of the vehicle.

7. The method of claim 2, wherein the at least one second parameter defines a maximum sensor intensity of the plurality of points as detected by a sensor of the vehicle.

8. The method of claim 1, further comprising receiving at least one third parameter defining a shape of the atmospheric effect.

9. The method of claim 8, wherein the shape comprises a portion of a ring surrounding the vehicle.

10. The method of claim 8, wherein the shape comprises multiple portions of a ring surrounding the vehicle.

11. The method of claim 1, wherein the atmospheric effect comprises at least one of fog, smog, smoke, mist, and steam.

12. The method of claim 1, wherein the vehicle comprises an autonomous vehicle (AV).

13. A method for simulating an atmospheric effect in a simulation system, the atmospheric effect comprising a particulate matter, the method comprising:
    emitting in the simulation system beams from a sensor associated with a vehicle;
    randomly selecting ones of the emitted beams to bounce back to the sensor at a distance a distance greater than a specified minimum distance from the sensor and less than a specified maximum distance from the sensor; and
    wherein the randomly selected ones of the emitted beams comprise a specified percentage of the emitted beams,
    wherein the simulation of the atmospheric effect comprises a ring of points surrounding the vehicle, the ring having an inner surface and an outer surface, and
    wherein the first and second parameters are used to dynamically adjust a distribution and intensity of the points within the ring to accurately represent varying atmospheric condition.

14. The method of claim 13, wherein the specified percentage of the emitted beams correspond to a density of the particulate matter of the atmospheric effect being simulated.

15. The method of claim 13, wherein the sensor comprises a light detection and ranging (LIDAR) device.

16. The method of claim 13, wherein the beams are emitted in a 360 degree sweep around the vehicle.

17. The method of claim 13, further comprising randomly assigning an intensity to each of the randomly selected ones of the beams, wherein the assigned intensity is greater than a specified minimum intensity and less than a specified maximum intensity.

18. The method of claim 13, wherein the atmospheric effect comprises at least one of fog, smog, smoke, mist, and steam.

19. A computer-implemented system for simulating an atmospheric effect in a simulation system, the atmospheric effect comprising a plurality of atmospheric particles, the computer-implemented system comprising:
    a processor; and
    one or more non-transitory computer-readable media storing instructions that when executed by the processor cause the processor to perform operations comprising:
    receiving a first parameter defining a density of the plurality of atmospheric particles comprising the atmospheric effect;
    receiving at least one second parameter defining a location of the atmospheric effect relative to a vehicle in a scene generate by the simulation system; and
    simulating the atmospheric effect in the scene as defined by the first parameter and the at least one second parameter,
    wherein the simulation of the atmospheric effect comprises a ring of points surrounding the vehicle, the ring having an inner surface and an outer surface, and
    wherein the first and second parameters are used to dynamically adjust a distribution and intensity of the points within the ring to accurately represent varying atmospheric condition.

* * * * *